US012130656B1

(12) United States Patent
Allen et al.

(10) Patent No.: US 12,130,656 B1
(45) Date of Patent: *Oct. 29, 2024

(54) SKEW-CORRECTING CLOCK BUFFER

(71) Applicant: Acacia Communications, Inc., Maynard, MA (US)

(72) Inventors: Gavin Allen, Greenwood (AU); Ian Dedic, London (GB); Bo Yang, Sunnyvale, CA (US); Taran Gupta, Santa Clara, CA (US)

(73) Assignee: ACACIA COMMUNICATIONS, INC., Maynard, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/343,841

(22) Filed: Jun. 29, 2023

Related U.S. Application Data

(63) Continuation of application No. 17/833,306, filed on Jun. 6, 2022, now Pat. No. 11,698,658, which is a continuation of application No. 17/179,229, filed on Feb. 18, 2021, now abandoned.

(60) Provisional application No. 62/979,275, filed on Feb. 20, 2020.

(51) Int. Cl.
*G06F 1/10* (2006.01)
*H03K 3/037* (2006.01)

(52) U.S. Cl.
CPC ............... *G06F 1/10* (2013.01); *H03K 3/037* (2013.01)

(58) Field of Classification Search
CPC .................................. G06F 1/10; G06F 1/105
See application file for complete search history.

(56) References Cited

U.S. PATENT DOCUMENTS

| 6,466,074 | B2 | 10/2002 | Vakil et al. | |
| 11,543,850 | B1* | 1/2023 | Dedic | ........... H03F 3/505 |
| 11,698,658 | B1 | 7/2023 | Allen et al. | |

* cited by examiner

*Primary Examiner* — Patrick O Neill
(74) *Attorney, Agent, or Firm* — K&L GATES LLP

(57) ABSTRACT

A method system, and apparatus for adjusting skew in a circuit comprising feeding an input clock into a first push-pull source follower stage, feeding an inverse of an input clock bar into a first CMOS inverter stage, creating an output clock based on an equal contribution of the input clock of the first push-pull follower stage and the inverse of the input clock bar of the first CMOS invert stage, feeding the input clock bar into a first push-pull source follower stage, feeding an inverse of the input clock into a first CMOS inverter stage, and creating an output clock based on an equal contribution of the input clock bar of the first push-pull follower stage and the inverse of the input clock bar of the first CMOS invert stage.

20 Claims, 4 Drawing Sheets

SKEW-CORRECTING CLOCK BUFFER

CROSS-REFERENCE TO RELATED APPLICATIONS

This application is a continuation application claiming priority under 35 U.S.C. § 120 to U.S. patent application Ser. No. 17/833,306, filed Jun. 6, 2022, entitled SKEW-CORRECTING CLOCK BUFFER, now U.S. Pat. No. 11,698, 658, issued Jul. 11, 2023, which is a Continuation of U.S. patent ppplication Ser. No. 17/179,229, filed Feb. 18, 2021 entitled Skew-Correcting Clock Buffer, which claims the benefit of U.S. Provisional Patent Application Ser. No. 62/979,275 filed Feb. 20, 2020 entitled Skew-Correcting Clock Buffer, which is hereby incorporated herein by reference in its entirety for all purposes. This application is related to U.S. Provisional Patent Application Ser. No. 62/950,612 filed Dec. 19, 2019 entitled High-Q Clock Buffer; U.S. Patent Application Ser. No. 62/879,095 filed Jul. 26, 2019 entitled Switch; U.S. patent application Ser. No. 16/564,044 filed Sep. 9, 2019 entitled High-Q Switch Inductor; U.S. patent application Ser. No. 16/587,191 filed Sep. 30, 2019 entitled Distributed Voltage Controlled Oscillator (VCO), and U.S. patent application Ser. No. 16/685, 063 filed Nov. 15, 2019 entitled Clock Buffer Inductor; all of which are hereby incorporated by reference in their entirety for all purposes.

BACKGROUND

Optical transmission of information over a fiber optic cable often encodes the information on a light wave.

SUMMARY

A method system, and apparatus for adjusting skew in a circuit comprising feeding an input clock into a first push-pull source follower stage, feeding an inverse of an input clock bar into a first CMOS inverter stage, creating an output clock based on an equal contribution of the input clock of the first push-pull follower stage and the inverse of the input clock bar of the first CMOS invert stage, feeding the input clock bar into a first push-pull source follower stage, feeding an inverse of the input clock into a first CMOS inverter stage, and creating an output clock based on an equal contribution of the input clock bar of the first push-pull follower stage and the inverse of the input clock bar of the first CMOS invert stage.

BRIEF DESCRIPTION OF THE FIGURES

Various aspects and embodiments of the application will be described with reference to the following example embodiments. It should be appreciated that the figures are not necessarily drawn to scale.

DETAILED DESCRIPTION

Figure 1:
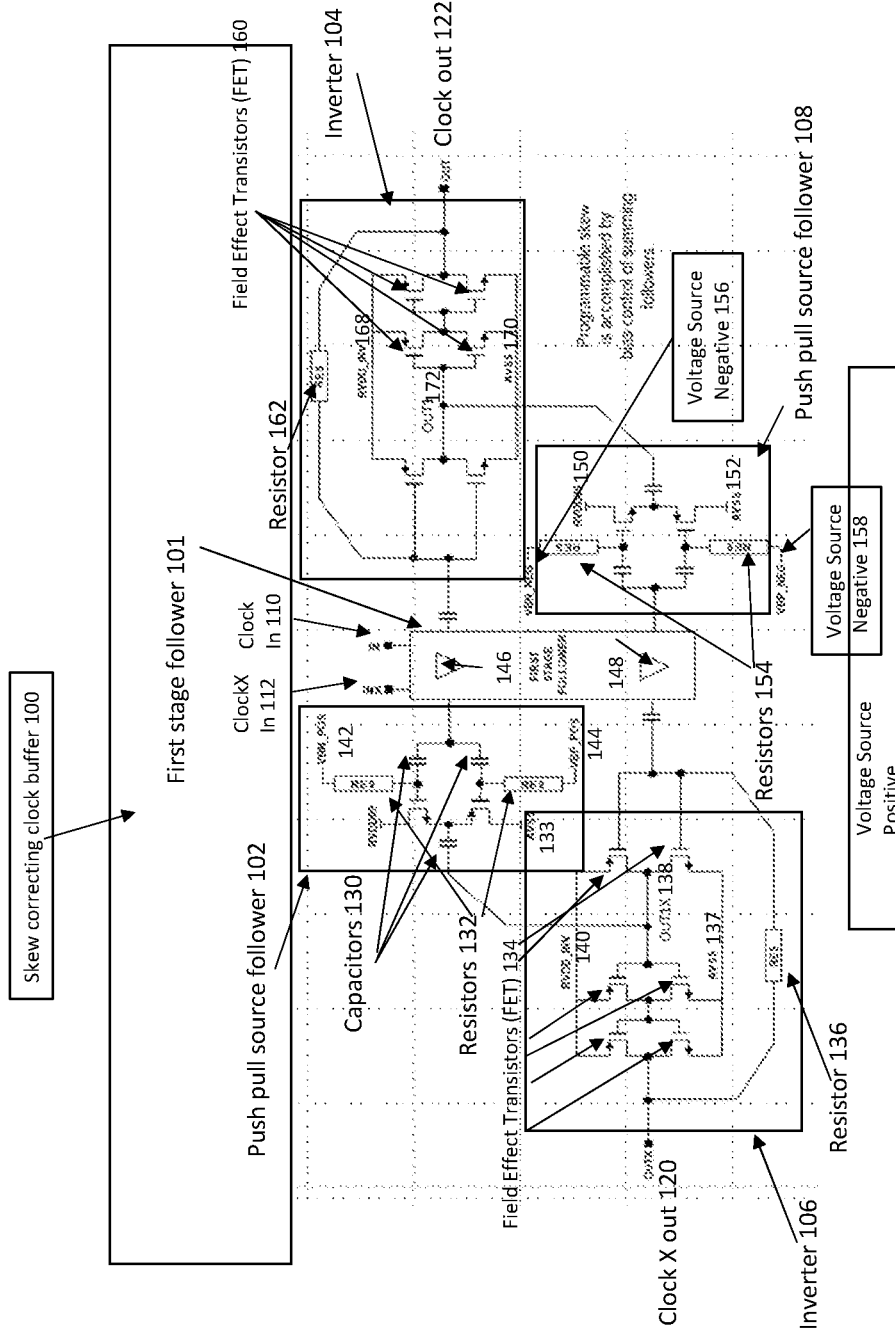
FIG. 1 is a simplified illustration of a skew-correcting clock buffer, in accordance with an embodiment of the present disclosure.

In many embodiments, a communication or transmission system may include a transmitter and a receiver. In some embodiments, a communication system may include two transceivers. In most embodiments, a transmission, such as a set of bits, may be encoded in a signal at a transmitter. In most embodiments, a transmitter may transmit an encoded signal to a receiver. In certain embodiments, a receiver may receive a signal from a transmitter and decode the signal into information. In almost all embodiments, there may be a number of conditions that may impact the signal which may make it hard to decode the information. In certain embodiments, a signal may be transmitted over an RF connection. In other embodiments, a signal may be transmitted over an optical link.

In some embodiments, in a coherent optical system, a digital electrical signal may be received. In certain embodiments, a digital electrical signal may be converted to an analog signal. In many embodiments, an analog signal may be converted to an optical signal. In almost all embodiments, a received optical signal may need to be converted to an analog signal, which may need to be converted to an electrical signal.

In most embodiments, a coherent optical communication system may have high data rates. In almost all embodiments, it may be necessary to divide data received into discrete time intervals. In many embodiments, a clock on a transmitter may determine when a signal is sent out. In some embodiments, an analog to digital converter may determine when samples are taken and converted into a digital format. In many embodiments, in a coherent optical system, it may be necessary to do a conversion between a digital signal and an analog signal at many gigabaud per second. In most embodiments, in a coherent optical signal, it may be necessary to convert an optical signal to an analog signal at many gigabaud per second. In some embodiments, in a coherent optical system, it may be necessary to convert an analog signal to an electrical signal at many gigabaud per second. In most embodiments in a coherent optical system, a conversion between digital to analog, analog to optical, optical to analog, and analog to digital may need to run at speeds of 50-60 gigabaud or faster per second.

In many embodiments, accuracy of a conversion may need to be high and signal to noise distortion of the signal may need to be low. In almost all embodiments, accurate conversion of a signal may require an accurate clock at both a transmission site and at a receive site. In most embodiments, a clock may need to run at a high speed and have very high slew rates. In certain embodiments, slew rate may be 2 pi times the frequency of the clock. In many embodiments, if a clock moves in time, such as jittering backward or forward in time, this may introduce a time error into a communication system which may then introduce a voltage error which may degrade the accuracy of a communication.

In some embodiments, the current disclosure may enable a low-power, low jitter clock distribution for high-speed (tens of giga samples) circuits including ADC, DAC and SERDES. In many embodiments, an ADC or DAC may require multiple differential clocks, where it may be necessary to ensure low skew between clocks such as CLK and CLKB.

In certain embodiments, with Complementary Metal Oxide Semiconductor (CMOS) clock distribution, a common and widely-used approach may be to use cross-coupled inverters at different stages in a clock tree between CLK and CLKB, to try and force two clocks to be in antiphase. In many embodiments, a clock tree may refer to the distribution of a clock across one or more circuits. In most embodiments, Applicants have realized that there may be problems trying to force two clocks to be in antiphase, such as poor rejection of skew in each stage, added power consumption, and added sensitivity to device mismatch (which causes skew). In many embodiments, Applicants have realized that if inverters are used to reduce skew, then inverters typically need to be placed where skew is introduced into a circuit.

In most embodiments, Applicants have realized that inverters require power to be driven, may increase the load of a circuit and may increase the power requirements of a circuit. In almost all embodiments, Applicants have realized that an inverter may reduce skew in a circuit or stop skew from building up, but an inverter is typically unable to remove all skew. In most embodiments, Applicants have realized that inverters may take power by adding capacitance, which increases load for buffers needing to be driven, which further slows a circuit.

In many embodiments, apart from skew reduction for clocks in an ADC/DAC, there may be a need to provide deliberate and adjustable skew between output clocks. In some embodiments, Applicants have realized that typical solutions to adjust skew may require more circuitry which may increase power consumption and add more unwanted skew. In further embodiments, it may be necessary to introduce skew into clocks to enable calibration of the clocks. In most embodiments, Applicants have realized that even if clocks coming into a circuit are perfectly aligned, by the time the clock is buffered and driven, there may be skew due to device mismatch. In other embodiments, incoming clocks may have skew from before they arrive in a circuit. In further embodiments, buffers of a circuit may introduce skew.

In many embodiments, Applicants have realized that it may be beneficial to use a non-inverting buffer to remove unwanted skew or add desired skew into clocks. In most embodiments, Applicants have realized that a non-inverting buffer may be able to eliminate most if not all skew. In many embodiments, a circuit may be able to measure a skew difference. In most embodiments, a skew of a circuit may be actively managed by determining skew and adding or removing skew as desired. In many embodiments, if a circuit measures skew digitally, then a feedback loop to add or remove skew may operate continuously. In most embodiments, changing skew may be performed by changing voltages in a circuit. In certain embodiments, measuring skew may be performed digitally. In most embodiments, if skew is measured digitally, skew compensation may occur at set times.

In some embodiments, instead of CMOS inverters in both clock paths and cross-coupling paths, the clocks may be deskewed using CMOS inverter stages together with non-inverting push-pull source follower stages. In certain embodiments, a differential clock buffer may consist of a CLKIN→OUT1: push-pull source follower, CLKINB→OUT1: CMOS inverter CLKIN→OUT1X: CMOS inverter, and CLKINB→OUT1X: push-pull source follower.

In some embodiments, each output clock may have equal contributions from two input clocks, so if one input clock is delayed in time by T both output clocks may be delayed by T/2, so there is no skew between them. In certain embodiments, contributions from two input clocks may be used to cancel the phase skew at the clock buffer input. In many embodiments, due to an analog nature, a clock buffer with contributions of two input clocks and an output push pull source follower, the input phase skew cancellation may change with PVT variations.

In some embodiments, a biasing circuit for push-pull source followers may be used for skew correction in a clock buffer. In certain embodiments, biasing currents of source followers may be adjusted in opposite directions to introduce deliberate (wanted) clock skew into CLKOUT as well as cancelling skew on CLKIN without an increase in power. In some embodiments, if delay and drive strengths of a push-pull source follower and CMOS inverter are matched, this may give 100% rejection of clock skew in a single stage, with no added power consumption for deskewing. In most embodiments, each circuit used for clock deskew may be half the size of a CMOS inverter in a conventional clock buffer. In many embodiments, two parallel circuits may give a same drive strength as a conventional CMOS inverter. In most embodiments, the current disclosure may enable a system that is enable to reduce more skew than a conventional cross-coupled inverter circuit where one stage can only reduce skew by 2×-3× and power is increased because of the additional inverters.

In some embodiments, drive strength of a push-pull source-follower may be adjusted by using AC coupling to gates and adjusting DC bias voltages to match a characteristic such as current with an inverter, for example using replica bias circuits. In certain embodiments, if DC gate voltage is increased (on an NMOS transistor) this increases current, which reduces delay, which may be used to adjust the skew. In many embodiments, adjusting strength of a push-pull source follower may be adjusted to be higher or lower to allow intentional skew to be introduced between clock outputs, for example to compensate for skew later on in a clock path or introduce desired skew without the need for additional power. In most embodiments, a push-pull source follower may enable effective removal of clock skew without any power penalty as well as allowing deliberate controlled introduction of skew without any power penalty.

In some embodiments, to program Ibias (bias current) for PMOS (IBP) and Ibias (bias current) for NMOS IBN currents for an input phase skew or output phase skew cancellation, it may be necessary to have a current mode DAC with large range and fine resolution to achieve the performance needed. In some embodiments, a biasing circuit may need four amplifiers. In most embodiments, circuits consume powers and may need a large layout space. In some embodiments, two switched-cap circuits may be added at OUT1 and OUT1X instead of programming IBP and IBN to introduce deliberate (wanted) clock skew into CLKOUT as well as cancelling skew on CLKIN. In certain embodiments, a biasing circuit may be shared with replica push-pull source followers with the first stage follower in order to remove a biasing circuit. In alternative embodiments, instead of CMOS inverters in both clock paths and cross-coupling paths, the clocks may be deskewed using CMOS inverter stages together with non-inverting push-pull source follower stages.

Refer now to the example embodiment of FIG. 1, which illustrates skew correcting clock buffer 100. In the example embodiment of FIG. 1, a differential clock buffer consists of:
  CLKIN→OUT1: push-pull source follower
  CLKINB→OUT1: CMOS inverter
  CLKIN→OUT1X: CMOS inverter
  CLKINB→OUT1X: push-pull source follower
In the example embodiment of FIG. 1, AVSS stands for analogue ground, RVDD_INV is a regulated supply to inverters, triangles 146 and 148 in first stage follower 101 are input clock buffers (source followers) to prevent circuit from loading input clocks IN 110 and INX 112. In many embodiments, buffers may be used to remove a load from a circuit.

Referring back to the example embodiment of FIG. 1, each output has equal contributions from the two input clocks, so if one input clock, such as ClockX 112 or Clock in 110, is delayed in time by T both output clocks, such as ClockX out 120 and clock out 122, are delayed by T/2, so there is no skew between them. This feature is used to cancel the phase skew at the clock buffer input. Due to the analog nature of this clock buffer, the input phase skew cancellation changes with PVT variations. In addition in the example embodiment of FIG. 1, if drive strengths of the two source followers are adjusted in opposite directions, this can be used to introduce deliberate (wanted) clock skew into CLKOUT as well as rejecting skew on CLKIN, with no power increase.

In the example embodiment of FIG. 1, a simplified way to understand how clock skew is removed is to consider the mathematical timing by examining first stage follower 101, push pull source follower 102, inverter 104, inverter 106, and push pull source follower 108. ClockX 112, which is clock bar and should in a perfect world be the inverse of Clock in 110, is sent to push pull source follower 102 and inverter 104. As well, Clock In 110, which should be the inverse of clock bar 112 in a perfect world, is sent to inverter 106 and push pull source follower 108. In many embodiments, a clock and clock bar may have skew between each and thus may not be an inverse of each other. In some embodiments, one edge of a clock may be moved relative to an edge of its inverse clock.

Referring back to the example embodiment of FIG. 1, Clock bar 112 and the inverse of clock 110 are combined as push pull source follower 102 inputs clock bar 112 into inverter 106 and inverter 106 inverts clock 110 to be clock bar. In a mathematical sense, what the circuits of push pull follower 102 and inverter 106 do is to combine basically sum half of clock bar signal with half of what is an inverse of clock, which should be equivalent to clock bar. Thus, in the mathematical sense, push pull source follower 102 and inverter 106 takes the average between what came in as clock bar and the inverse of the clock signal and outputs it as clock X out 120.

Inverter 104 takes the inverse of Clock X 112, or clock bar, and combines it with Clock in 110 from push pull source follower 108, where half of each signal feeds the output for the clock out signal 122. In a mathematical sense, what push pull follower 108 and inverter 104 do is the similar to what push pull source follower 102 and inverter 106 do, except with a clock signal and an inverse of a clock bar signal. Thus, in the mathematical sense, inverter 104 and push pull source follower 108 takes the average between what was input as clock and the inverse of clock bar and outputs it as the clock signal. Moreover, as the pair push pull source follower 102 and inverter 106 and inverter 104 and push pull source follower 108 do the same function with clock bar and the inverse of clock, and clock and the inverse of clock bar, respectively, the output clock and clock bar signals should have no skew between them.

Push pull source follower 102 has capacitors 130, VBN_POS 142 and VBP_POS 144, capacitors 130, resisters 132, and AVSS 133. Inverter 106 has field effect transistors 134, resister 136, AVSS 137, out1x 138 RVDD_INV 140. Inverter 104 has field effect transistors 160, resister 162, RVDD_INV 168, AVSS 170, and OUT1 172. Push pull source follower 108 has RVDD09 150, AVSS 152, Resisters 154.

In many embodiments, elements of a skew correcting clock buffer may enable biasing of transistors to get a known current at a known speed at different parts of the skew correcting clock buffer circuit. Referring back to the example embodiment of FIG. 1, a clock signal is AC coupled to inverter 104 from first stage follower 101. Resistor 162 is fed back from clock out 122. Resistor 162 biases input threshold of inverter 104 to get close to a 50/50 duty cycle, which sets a bias point for inverter 104. Inverter 104 has output 172 connected to push pull source follower 108.

Figure 2:
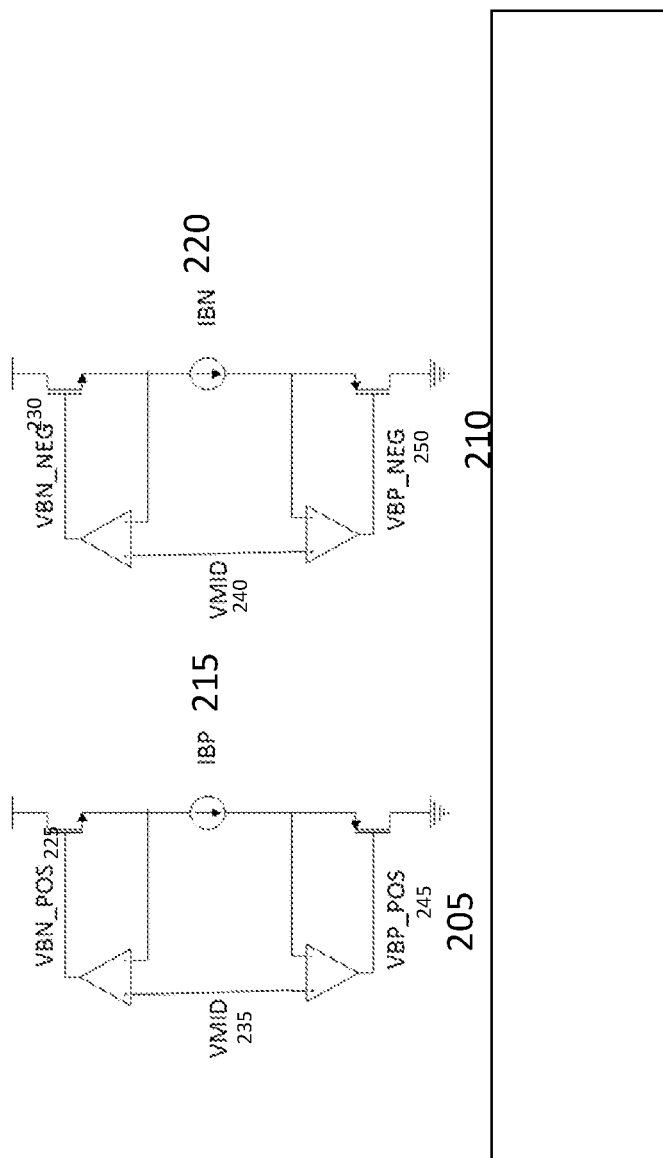
FIG. 2 is a simplified illustration of a biasing circuit for replica push-pull source followers, in accordance with an embodiment of the present disclosure.

Refer now to the example embodiment of FIG. 2. The example embodiment of FIG. 2 shows a biasing circuit for push-pull source followers of the skew correction clock buffer in FIG. 1. In the example embodiment of FIG. 2, during the normal operation mode, biasing currents IBP 215 and IBN 220 are the same. If the biasing currents of the two source followers, 205 and 210, are adjusted in opposite directions, this can be used to introduce deliberate clock skew into CLKOUT as well as cancelling skew on CLKIN, with no power increase. Source follower 205 has VBN_POS 225, VMID 235, and VBP_POS 245. Source follower 210 has VBN_NEG 230, VMID 240, and VBN_NEG 250. In source follower 210, top amplifier controls VB_NEG 230 so the source of the NMOS is at VMID 240. Bottom loop controls gate to the P source of PMOS is also VMID coming in. The bias lines are to control source follower right at voltage transistor.

In some embodiments, if delay and drive strengths of a push-pull source follower and CMOS inverter are matched, this may give 100% rejection of clock skew in a single stage, with no added power consumption for deskewing—where each circuit is half the size of the CMOS inverter in a conventional clock buffer, but the two parallel circuits may give the same drive strength. In most embodiments, where delay and drive strengths of a push-pull source follower and CMOS inverter are matched, this may provide a better solution than a conventional cross-coupled inverter circuit where one stage can reduce skew by 2×-3× and power is increased because of the additional inverters.

In some embodiments, drive strength of a push-pull source-follower may be adjusted by using AC coupling to gates and adjusting DC bias voltages to match a characteristic such as current with the inverter, for example using replica bias circuits. In certain embodiments, drive strength may be adjusted to be higher or lower to allow intentional skew to be introduced between clock outputs, for example to compensate for skew later on in the clock path or introduce desired skew, with no additional power. In many embodiments, a circuit, such as the circuit of FIG. 2, may allow for more effective removal of clock skew without a power penalty and may also allow deliberate controlled introduction of skew without a power penalty.

Figure 3:
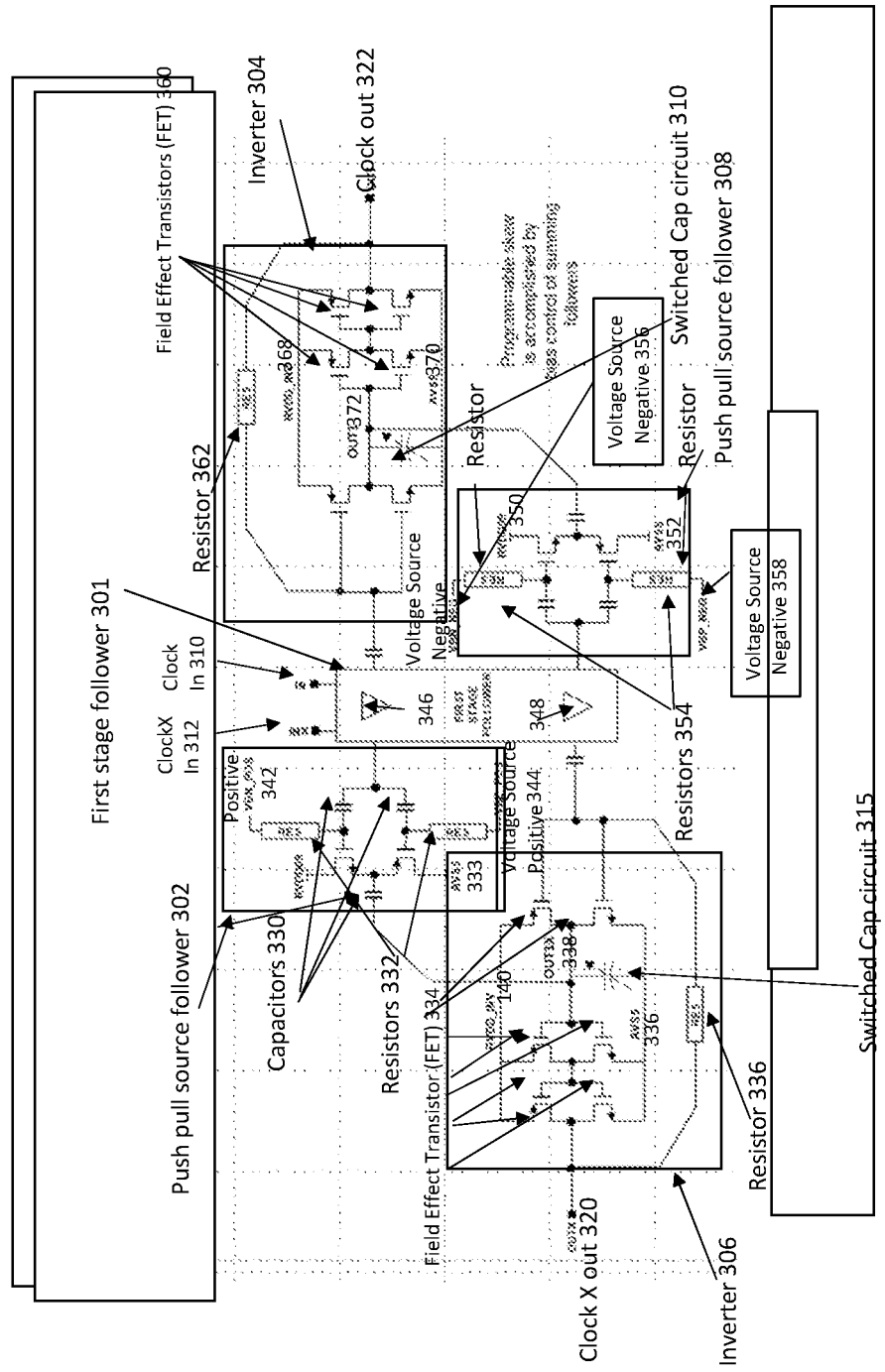
FIG. 3 is a simplified illustration of a skew-correcting clock buffer with adjustable capacitance circuits, in accordance with an embodiment of the present disclosure.

Refer now to the example embodiment of FIG. 3. The example embodiment of FIG. 3 illustrates an alternative embodiment of a skew-correcting clock buffer as compared to FIG. 1. In many embodiments, in order to program IBP and IBN currents for the input phase skew or output phase skew cancellation, a current mode DAC with large range and fine resolution may be needed to achieve the performance needed. In some embodiments, a biasing circuit, such as the example embodiment of FIG. 2, may need four amplifiers. In most embodiments, a DAC and amplifiers may consume powers and need large layout space.

Referring back to the example embodiment of FIG. 3, two switched-cap circuits 315 and 310 are at OUT1 338 and OUT1X 372 instead of programming IBP and IBN to introduce deliberate clock skew into CLKOUT as well as cancelling skew on CLKIN. In some embodiments, a biasing circuit for the replica push-pull source followers may be shared with a first stage follower and may remove a biasing circuit, such as the circuit shown in the example embodiment of FIG. 2.

Referring back to the example embodiments of FIGS. 1, in the mathematical sense, each inverter source follower pair would take the average of clock, inverse of clock bar or inverse of clock, clock bar, respectively. This creates average clock values that should have no skew. Referring back to FIG. 3, the addition of switched capacitance circuit 315 and switched capacitance circuit 310 enables, in addition to removal of skew, addition of selective amounts of skew or delay into clock or clock bar. By selectively changing either the switched capacitance circuit 315 or switched capacitance 310 skew can be added to either clock or clock bar.

Push pull source follower 302 has capacitors 330, VBN_POS 342 and VBP_POS 344, capacitors 330, resistors 332, and AVSS 333. Inverter 306 has field effect transistors 334, resistor 336, AVSS 337 out1x 338 RVDD_INV 340. Inverter 304 has field effect transistors 360, resistor 362, RVDD_INV 368, AVSS 370, and OUT1 372. Push pull source follower 308 has RVDD09 350, AVSS 152, and resistors 354.

In many embodiments, the ability to selectively add skew may a skew correction clock buffer to correct for skew that occurs in later circuits. In a particular embodiment, there may be a way to measure skew at the final output of circuits. In many embodiments, the presence of skew may be measured indirectly such as looking at gain, distortion, or linearity in a final output or signal. In some embodiments, given a way to measure skew, indirectly or directly, it may be possible to provide feedback to a skew correction clock buffer, such as the example embodiment of FIG. 3, to reduce, remove, or otherwise compensate for such skew. In some embodiments, adjustment or addition of helpful skew may tweak delays between clocks to correct for clock skew that occurs later in a system. In many embodiments, feedback to a skew correction clock buffer may tweak delays between clocks to optimize an overall system.

In some embodiments, output target detection may feed back digitally to a programmable capacitor. In certain embodiments, feedback may be provided by a state machine on a chip. In other embodiments, there may be logic or a processor on a chip that provides feedback. In further embodiments, software may be implemented to provide feedback to adjust skew. In certain embodiments, feedback may be provided to a binary capacitor in a skew correction clock buffer. In other embodiments, analog logic may provide feedback to control a switched capacitance circuit in a skew correction clock buffer. In some embodiments, digital logic may provide feedback to control a switched capacitance circuit in a skew correction clock buffer. In further embodiments, software may read a value, such as from an A2D and change a register setting that may adjust a switched capacitance circuit in a skew correction clock buffer.

Figure 4:
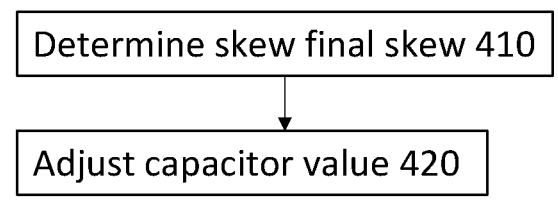
FIG. 4 is a simplified method for removing skew, in accordance with an embodiment of the present disclosure.

Refer now to the example embodiment of FIG. 4. A determination may be made for the final skew in a circuit or set of circuits (step 410). Based on the determined final skew, a capacitor value of a switched capacitor, such as one or both of the switched-cap circuits of FIG. 3, is adjusted to account for or remove the final skew (step 420).

In some embodiments, one or more of the techniques described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor.

In most embodiments, a processor may be a physical or virtual processor. In other embodiments, a virtual processor may be spread across one or more portions of one or more physical processors. In certain embodiments, one or more of the techniques or embodiments described herein may be embodied in hardware such as a Digital Signal Processor DSP. In certain embodiments, one or more of the embodiments herein may be executed on a DSP. One or more of the techniques herein may be programed into a DSP. One or more of the techniques herein may be fabricated in a DSP. In some embodiments, a DSP may have one or more processors and one or more memories. In certain embodiments, a DSP may have one or more computer readable storages. In other embodiments, one or more of the embodiments stored on a computer readable medium may be loaded into a processor and executed.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. An apparatus comprising:
   a Complementary Metal Oxide Semiconductor (CMOS) inverter stage;
   a non-inverting push-pull source follower stage paired with the CMOS inverter stage;
   a clock bar signal coupled to the non-inverting push-pull source follower stage; and
   an inverse of a clock signal coupled to the CMOS inverter stage to form a clock bar out signal, wherein the clock bar signal and the inverse of the clock signal contribute equally to forming the clock bar out signal.

2. The apparatus of claim 1, wherein the non-inverting push-pull source follower stage adjusts a skew of the clock bar signal based on a bias current in the non-inverting push-pull source follower stage.

3. The apparatus of claim 1, wherein the CMOS inverter stage comprises a switched capacitor.

4. The apparatus of claim 3, wherein the switched capacitor injects skew into the clock bar out signal based on a value of the switched capacitor.

5. The apparatus of claim 3, further comprising an analog feedback loop to adjust a setting of the switched capacitor to remove clock skew.

6. The apparatus of claim 3, further comprising a digital feedback loop to adjust a setting of the switched capacitor to remove clock skew.

7. The apparatus of claim 3, further comprising software instructions to adjust a setting of the switched capacitor to remove clock skew.

8. An apparatus comprising:
   a Complementary Metal Oxide Semiconductor (CMOS) inverter stage;
   a non-inverting push-pull source follower stage paired with the CMOS inverter stage;
   a clock signal coupled to the non-inverting push-pull source follower stage; and
   an inverse of a clock bar signal coupled to the CMOS inverter stage to form a clock out signal, wherein the clock signal and the inverse of the clock bar signal contribute equally to forming the clock out signal.

9. The apparatus of claim 8, wherein the non-inverting push-pull source follower stage adjusts a skew of the clock signal based on a bias current in the non-inverting push-pull source follower stage.

10. The apparatus of claim 8, wherein the CMOS inverter stage comprises a switched capacitor.

11. The apparatus of claim 10, wherein the switched capacitor injects skew into the clock out signal based on a value of the switched capacitor.

12. The apparatus of claim 10, further comprising an analog feedback loop to adjust a setting of the switched capacitor to remove clock skew.

13. The apparatus of claim 10, further comprising a digital feedback loop to adjust a setting of the switched capacitor to remove clock skew.

14. The apparatus of claim 10, further comprising software instructions to adjust a setting of the switched capacitor to remove clock skew.

15. An apparatus comprising:
   a first Complementary Metal Oxide Semiconductor (CMOS) inverter stage;
   a first non-inverting push-pull source follower stage paired with the first CMOS inverter stage;
   a clock bar signal coupled to the first non-inverting push-pull source follower stage;
   an inverse of a clock signal coupled to the first CMOS inverter stage to form a clock bar out signal;
   a second Complementary Metal Oxide Semiconductor (CMOS) inverter stage;
   a second non-inverting push-pull source follower stage paired with the second CMOS inverter stage;
   a second clock signal coupled to the second non-inverting push-pull source follower stage; and
   an inverse of a clock bar signal coupled to the second CMOS inverter stage to combine to form a clock out signal.

16. The apparatus of claim 15, wherein the first non-inverting push-pull source follower stage adjusts a skew of the clock bar signal based on a bias current in the first non-inverting push-pull source follower stage; and wherein the second non-inverting push-pull source follower stage adjusts the skew of the clock signal based on a bias current in the second non-inverting push-pull source follower stage.

17. The apparatus of claim 15, wherein the first CMOS inverter stage comprises a first switched capacitor and wherein the second CMOS inverter stage comprises a second switched capacitor.

18. The apparatus of claim 17, wherein the first switched capacitor injects skew into the clock bar out signal based on a value of the first switched capacitor.

19. The apparatus of claim 17, wherein the second switched capacitor injects skew into the clock out signal based on a value of the second switched capacitor.

20. The apparatus of claim 17, further comprising at least one of an analog feedback loop, a digital feedback loop, or software instructions, wherein at least one of the analog feedback loop, the digital feedback loop, or the software instructions is enabled to adjust a setting of the first switched capacitor; and wherein the at least one of the analog feedback loop, the digital feedback loop, or the software instructions is enabled to adjust a setting of the second switched capacitor to account for clock skew occurring in later circuits.

* * * * *